United States Patent
Hong et al.

(10) Patent No.: US 8,615,323 B2
(45) Date of Patent: Dec. 24, 2013

(54) SUBSTRATE-PROCESSING APPARATUS AND METHOD OF TRANSFERRING SUBSTRATE IN THE SAME

(75) Inventors: Kwang-Jin Hong, Gangwon-Do (KR); Jun-Ho You, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 269 days.

(21) Appl. No.: 12/737,842

(22) PCT Filed: Apr. 9, 2009

(86) PCT No.: PCT/KR2009/001829
§ 371 (c)(1),
(2), (4) Date: Feb. 22, 2011

(87) PCT Pub. No.: WO2010/024512
PCT Pub. Date: Mar. 4, 2010

(65) Prior Publication Data
US 2011/0153062 A1    Jun. 23, 2011

(30) Foreign Application Priority Data

Aug. 28, 2008 (KR) .................. 10-2008-0084579

(51) Int. Cl.
*G06F 7/00* (2006.01)
(52) U.S. Cl.
USPC .................... 700/218; 198/525; 198/861.1
(58) Field of Classification Search
None
See application file for complete search history.

(56) References Cited

U.S. PATENT DOCUMENTS

| 4,894,598 | A  | * | 1/1990  | Daggett ............... 318/568.16 |
| 5,687,085 | A  | * | 11/1997 | Morimoto et al. ........... 700/121 |
| 7,699,021 | B2 | * | 4/2010  | Volfovski et al. ............ 118/500 |
| 2006/0172664 | A1 | * | 8/2006 | Chen et al. ...................... 451/5 |
| 2008/0159832 | A1 |   | 7/2008  | Mitsuyoshi |
| 2012/0141237 | A1 | * | 6/2012 | Rice et al. ............... 414/226.05 |

FOREIGN PATENT DOCUMENTS

| JP | 61-295918     | 12/1986 |
| JP | 7-307373      | 11/1995 |
| JP | 11312726 A    | 11/1999 |
| JP | 2002-264054   | 9/2002  |
| JP | 2003-285287   | 10/2003 |
| JP | 2005246547 A  | 9/2005  |
| JP | 2006-086294   | 3/2006  |
| JP | 2006-278508   | 10/2006 |

(Continued)

OTHER PUBLICATIONS

Examination Report dated Jul. 19, 2012 from the Japan Patent Office.

(Continued)

*Primary Examiner* — Ramya Burgess
*Assistant Examiner* — Lester Rushin
(74) *Attorney, Agent, or Firm* — Harness, Dickey & Pierce, P.L.C.

(57) ABSTRACT

Provided is a substrate-processing apparatus including a storage member, a transfer member, and a control unit. The transfer member includes a plurality of transfer arms that load or pick up a substrate to or from the storage member. The control unit controls velocity of the transfer arms such that the simultaneously driven transfer arms simultaneously arrive at target points. Accordingly, the transfer member loads or takes out a plurality of wafers at once to or from the storage member, so that the substrate-processing apparatus reduces transfer time and improves productivity.

14 Claims, 5 Drawing Sheets

(56) References Cited

FOREIGN PATENT DOCUMENTS

| | | |
|---|---|---|
| JP | 2007-203349 | 8/2007 |
| JP | 2007307373 A | 11/2007 |
| JP | 2008-166370 | 7/2008 |
| KR | 100676823 A | 1/2007 |

OTHER PUBLICATIONS

International Search Report.
Partial English translation of JP 7-307373 published Nov. 21, 1995.

* cited by examiner

SUBSTRATE-PROCESSING APPARATUS AND METHOD OF TRANSFERRING SUBSTRATE IN THE SAME

TECHNICAL FIELD

The present invention disclosed herein relates to an apparatus manufacturing a semiconductor substrate, and more particularly, to a substrate-processing apparatus processing a semiconductor substrate and a method of transferring the substrate in the substrate-processing apparatus.

BACKGROUND ART

In substrate-manufacturing processes, deposition and etching of dielectrics and metal materials, coating and development of photoresists, asher process, etc are repeated a plurality of times to achieve delicate arrangement of patterning. However, although these processes including the etching or the asher process are performed, foreign substances still remain in substrates. Processes for removing these foreign substances include a cleaning process using deionized water or chemical.

Substrate-cleaning apparatuses performing the cleaning process are classified into a batch substrate cleaning apparatus and a single substrate cleaning apparatus. The batch substrate cleaning apparatus includes a chemical bath, a rinse bath, and a dry bath having sizes capable of processing 25 substrates or 50 substrates at once. The batch substrate cleaning apparatus removes foreign substances by immersing substrates in the respective baths for predetermined times. Such a batch substrate cleaning apparatus simultaneously cleans upper and lower portions of a substrate and processes a large amount of substrates simultaneously. However, as the diameters of substrates are increased, the sizes of baths are also increased, so as to increase the size of an apparatus and the amount of chemical. In addition, foreign substances detached from adjacent substrates are attached to substrates being cleaned in a chemical bath.

Recently, as the diameter of substrates is increased, the single substrate cleaning apparatus is widely used. In the single substrate cleaning apparatus, a substrate is fixed to a substrate chuck in a chamber having a small size adapted for processing a single substrate, then rotated by a motor, and then chemical or deionized water is provided to the substrate through a nozzle disposed over the substrate. The spin of the substrate spreads the chemical or the deionized water on the upper portion of the substrate, so as to remove foreign substances from the substrate. The single substrate cleaning apparatus has a smaller size than the batch substrate cleaning apparatus and achieves a uniform cleaning performance.

In general, the single substrate cleaning apparatus includes, from a side thereof, a loading/unloading unit, an index robot, a buffer unit, process chambers, and a main transfer robot. The index robot transfers substrates between the buffer unit and the loading/unloading unit, and the main transfer robot transfers substrates between the buffer unit and the process chambers. At the buffer unit, substrates to be cleaned wait to be inserted into the process chambers, or the substrates that have been cleaned wait to be transferred to the loading/unloading unit.

A transfer robot such as the index robot and the main transfer robot includes a plurality of arms, and a substrate is loaded on each of the arms. The respective arms move horizontally to take out or load substrates from or to storage such as front open unified pods (FOUPs) or the buffer unit.

FIG. 1 is a graph illustrating velocity variation of an arm in a typical transfer robot, and FIG. 2 is a graph illustrating velocity variation of two arms in the typical transfer robot when the arms simultaneously move.

Referring to FIG. 1, each of the arms is accelerated from a start time point ST when a horizontal movement starts, to a first time point T1 when the arm reaches a maximum velocity UV, then the maximum velocity UV is kept from the first time point T1 to a second time point T2 when the arm is gradually decelerated. That is, the arm is in uniform motion at the maximum velocity UV from the first time point T1 to the second time point T2. The arm of the transfer robot is gradually decelerated from the second time point T2 to a target time point ET when the horizontal movement is finished, that is, to the point ET when the arm stops in a storage device.

As such, a horizontal movement profile of the arm in the transfer robot sequentially includes an acceleration division where the velocity is gradually increased, a constant velocity division where the arm moves in uniform motion, and a deceleration division where the velocity is gradually decreased.

Such a transfer robot's arms are driven independently, and thus the respective arms have separate horizontal driving shafts, and assembling tolerance occurs between the arms. Accordingly, when driving at least two arms together, velocities of the respective arms are different, so that time points when the respective arms arrive at target points are different.

Referring to FIG. 2, when the two arms A1 and A2 are moved horizontally together, the start time points ST when the two arms A1 and A2 start to move horizontally are the same, and the time points T1 when the two arms A1 and A2 reach the maximum velocity UV are the same. However, since the time point T2 when the first one A1 of the two arms A1 and A2 is decelerated is different from a time point T3 when the second one A2 is decelerated, time points ET1 and ET2 when the two arms arrive at target points are different.

As such, when simultaneously driving the arms of the transfer robot, the time points when the arms arrive at the target point are different, and thus it is difficult to simultaneously take out a plurality of substrates from the storage device.

DISCLOSURE OF INVENTION

Technical Problem

The present invention provides a substrate-processing apparatus improving efficiency in loading and unloading a substrate.

The present invention also provides a method of transferring a substrate in the substrate-processing apparatus.

Technical Solution

Embodiments of the present invention provide substrate-processing apparatuses including a storage member, a transfer member, and a control unit.

The storage member arranges a plurality of substrates in a vertical direction to store the substrates. The transfer member includes a plurality of transfer arms facing each other in the vertical direction, and an arm-driving part moving the respective transfer arms horizontally, and the substrates are loaded on the respective transfer arms, and the transfer member takes out and loads at least one substrate from and to the storage member. The control unit controls a movement velocity of the transfer member and controls the arm-driving part, and adjusts horizontal movement velocities of the selected ones from the transfer arms to be simultaneously driven according to controlling of the control unit, based on expectation times consumed for the selected transfer arms respectively arrive at target points in the storage member, such that the selected transfer arms simultaneously arrive at the target points.

In other embodiments of the present invention, substrate-processing apparatuses include a storage container, a buffer unit, an index robot, and a first control unit.

The storage container spaces substrates to be processed or processed substrates in a vertical direction to store the substrates. The buffer unit spaces the substrates to be processed and the processed substrates in the vertical direction to store the substrates. The index robot includes a plurality of index arms facing each other in the vertical direction, and an arm-driving part moving the respective index arms horizontally. The substrates are loaded on the respective index arms. The index robot transfers the substrate between the storage container and the buffer unit, and takes out and loads at least one substrate from and to the storage container or the buffer unit. The first control unit controls a movement velocity and a position of the index robot, and the first control unit adjusts horizontal movement velocities of the selected from the index arms to be simultaneously driven according to controlling of the control unit, based on expectation times consumed for the selected index arms respectively arrive at target points in the storage container, such that the selected index arms simultaneously arrive at the target points.

In some embodiments, the substrate-processing apparatuses may further include a process chamber, a main transfer robot, and a second control unit. The substrate is processed in the process chamber. The main transfer robot includes a plurality of pick-up hands facing each other in the vertical direction, and a hand-driving part moving the respective pick-up hands horizontally. The substrates are loaded on the respective pick-up hands. The main transfer robot transfers the substrate between the process chamber and the buffer unit, and takes out and loads at least one substrate from and to the buffer unit. The second control unit controls a movement velocity and a position of the main transfer robot, and the second control unit controls the hand-driving part such that at least two of the pick-up hands simultaneously arrive different target points in the buffer unit by controlling movement velocities of the respective pick-up hands.

In still other embodiments of the present invention, methods of transferring a substrate include: generating movement velocity informations including maximum velocities, decelerations, and accelerations of respective transfer arms of a transfer member transferring the substrate; calculating, based on position values of target points corresponding to the respective transfer arms and on the movement velocity informations, expectation times consumed for the respective transfer arms to arrive at the corresponding target points; resetting velocities of the respective transfer arms, based on the calculated expectation times and on the movement velocity informations such that the transfer arms have a same consumed time; and simultaneously and horizontally moving the transfer arms with the reset velocities to simultaneously take out or load a plurality of substrates from or to a storage member.

In some embodiments, the resetting of the velocities may include: comparing the calculated expectation times to set the longest one of the calculated expectation time as a maximum expectation time; and resetting the velocity of the transfer arm having the expectation time less than the maximum expectation time adjust the transfer arms to have the same consumed time.

Advantageous Effects

According to the present invention, the substrate-processing apparatus includes the control part adjusting the velocities of the transfer arms, and controls the simultaneously driven transfer arms to simultaneously arrive at the target points. Accordingly, the transfer member loads or takes out a plurality of substrates to or from the storage member at once, so that the substrate-processing apparatus reduces the transfer time and improves the productivity.

BRIEF DESCRIPTION OF DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

MODE FOR THE INVENTION

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 3:
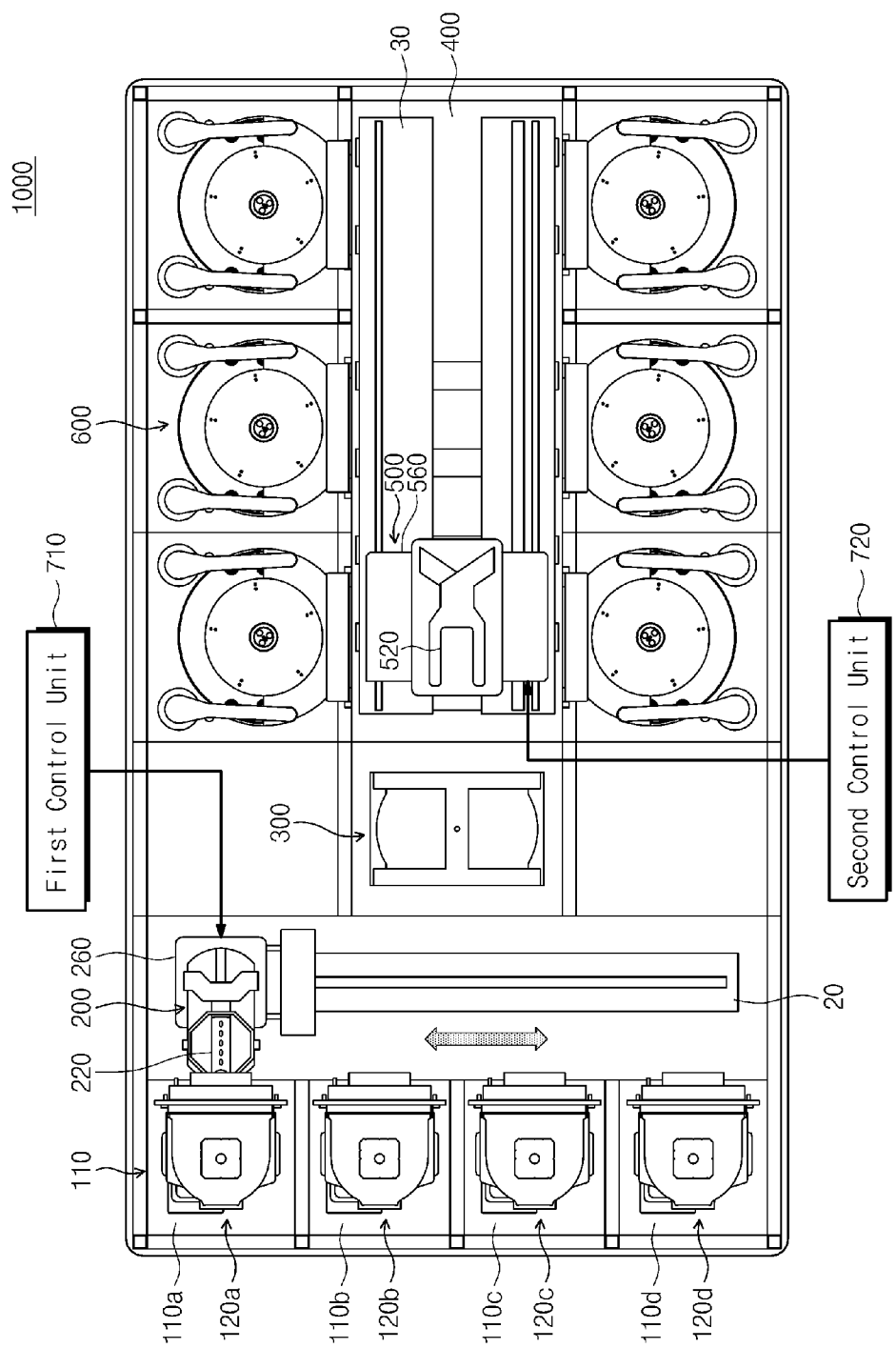
FIG. 3 is a schematic view illustrating a substrate-processing system according to an embodiment of the present invention.
Figure 4:
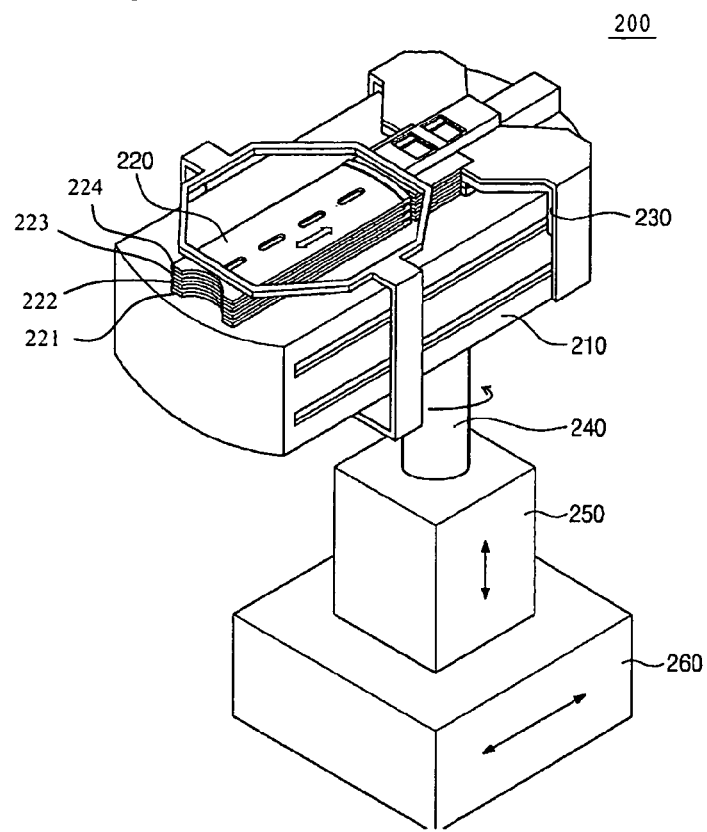
FIG. 4 is a perspective view illustrating an index robot illustrated in FIG. 3.

FIG. 3 is a schematic view illustrating a substrate-processing system 1000 according to an embodiment of the present invention. FIG. 4 is a perspective view illustrating an index robot 200 illustrated in FIG. 3.

Referring to FIGS. 3 and 4, the substrate-processing system 1000 may include a loading/unloading unit 110, the index robot 200, a buffer unit 300, a main transfer robot 500, a plurality of process chambers 600, and first and second control units 710 and 720.

The loading/unloading unit 110 includes a plurality of load ports 110a, 110b, 110c, and 110d. Although the loading/unloading unit 110 includes the four load ports 110a, 110b, 110c, and 110d in this embodiment, the number of the load ports 110a, 110b, 110c, and 110d may be increased or decreased according to process efficiency and footprint conditions of the substrate-processing system 1000.

Front open unified pods (FOUPs) 120a, 120b, 120c, and 120d are placed on the load ports 110a, 110b, 110c, and 110d. Wafers are stored in the FOUPs 120a, 120b, 120c, and 120d. The respective FOUPs 120a, 120b, 120c, and 120d are provided with a plurality of slots for storing wafers horizontally to a ground. The FOUPs 120a, 120b, 120c, and 120d store wafers that was loaded and have been processed in the process chamber 600 or wafers that will be loaded and processed in the process chamber 600. Hereinafter, for convenience, wafers that have been processed by the substrate-processing system 1000 are referred to as processed wafers, and wafers that are not processed yet are referred to as primitive wafers.

The index robot 200 is disposed between the loading/unloading unit 110 and the buffer unit 300, and a first transfer rail 20 is disposed below the index robot 200. The index robot 200 moves along the first transfer rail 20 and transfers wafers. The index robot 200 may include an arm-driving part 210, an index arm part 220, a plurality of connection parts 230, a rotation part 240, a vertical movement part 250, and a horizontal movement part 260.

Particularly, the arm-driving part 210 moves respective index arms 221, 222, 223, and 224 horizontally. The index arms 221, 222, 223, and 224 are separately driven by the arm-driving part 210.

An upper portion of the arm-driving part 210 is provided with the index arm part 220. The index arms 221, 222, 223, and 224 face each other in the vertical direction, and a wafer is loaded on each of the index arms 221, 222, 223, and 224. In this embodiment, the index robot 200 is provided with the four index arms 221, 222, 223, and 224, but the number of the index arms 221, 222, 223, and 224 may be increased according to the process efficiency of the substrate-processing system 1000.

The index arms 221 and 222 transferring primitive wafers may be referred to as load index arms, and the index arms 223 and 224 transferring processed wafers may be referred to as unload index arms. In this case, the load index arms 221 and 222 and the unload index arms 223 and 224 are disposed separately, not alternately. For example, the unload index arms 223 and 224 may be disposed over the load index arms 221 and 222. Accordingly, the index robot 200 prevents processed wafers from being contaminated by primitive wafers while transferring the primitive wafers and the processed wafers, thereby improving the yield of products.

The load index arms 221 and 222 placed on the loading/unloading unit 110 take out primitive wafers from any one of the waiting FOUPs 120a, 120b, 120c, and 120d and then load the primitive wafers to the buffer unit 300. The index robot 200 takes out at least one primitive wafer at once from the waiting FOUPs 120a, 120b, 120c, and 120d. That is, the load index arms 221 and 222 may simultaneously insert primitive wafers to the process-waiting FOUPs 120a, 120b, 120c, and 120d and then simultaneously take out the primitive wafers. Thus, two primitive wafers may be simultaneously taken out from the process-waiting FOUPs 120a, 120b, 120c, and 120d.

Also, the index robot 200 loads at least one primitive wafer to the buffer unit 300. That is, the load index arms 221 and 222 may be simultaneously inserted to the buffer unit 300 and then simultaneously load primitive wafers thereon to the buffer unit 300. Thus, two primitive wafers may be simultaneously loaded on the buffer unit 300.

For example, the maximum number of wafers taken out by the index robot 200 at once from the process-waiting FOUPs 120a, 120b, 120c, and 120d and the maximum number of wafers loaded at once to the buffer unit 300 are equal to the number of the load index arms 221 and 222.

The unload index arms 223 and 224 unload processed wafers from the buffer unit 300 and load the processed wafers to the index robot 200. The index robot 200 unloads at least one processed wafer at once from the buffer unit 300. That is, the unload index arms 223 and 224 may be simultaneously inserted to the buffer unit 300 and then simultaneously unload primitive wafers from the buffer unit 300. Thus, two primitive wafers may be simultaneously taken out from the buffer unit 300.

Also, the index robot 200 loads at least one processed wafer at once to the process-waiting FOUPs 120a, 120b, 120c, and 120d again. That is, the unload index arms 223 and 224 are simultaneously inserted into the process-waiting FOUPs 120a, 120b, 120c, and 120d, and then simultaneously load processed wafers placed thereon to the process-waiting FOUPs 120a, 120b, 120c, and 120d. Thus, two processed wafers are simultaneously loaded to the process-waiting FOUPs 120a, 120b, 120c, and 120d.

For example, the maximum number of wafers taken out by the index robot 200 at once from the buffer unit 300 and the maximum number of wafers loaded at once to the FOUPs 120a, 120b, 120c, and 120d are equal to the number of the unload index arms 223 and 224.

As such, the index robot 200 takes out and loads a plurality of wafers at once from and to the FOUPs 120a, 120b, 120c, and 120d and the buffer unit 300, thereby reducing time for transferring wafers and improving productivity.

The index arm part 220 is connected to the connection parts 230. The connection parts 230 are coupled to the arm-driving part 210 to move horizontally the connected index arms 221, 222, 223, and 224 according to driving of the arm-driving part 210.

The rotation part 240 is disposed below the arm-driving part 210. The rotation part 240 is coupled to the arm-driving part 210 and rotates to rotate the arm-driving part 210. Accordingly, the index arm part 220 is also rotated.

The vertical movement part 250 is disposed under the rotation part 240, and the horizontal movement part 260 is disposed under the vertical movement part 250. The vertical movement part 250 is coupled to the rotation part 240 to move the rotation part 240 upward and downward, and thus, vertical positions of the arm-driving part 210 and the index arm part 220 are adjusted. The horizontal movement part 260 is coupled to the first transfer rail 20 and moves horizontally along the first transfer rail 20. Accordingly, the index robot 200 moves along an arrangement direction of the load ports 110a, 110b, 110c, and 110d.

The buffer unit 300 is disposed between a region where the index robot 200 is disposed, and a region where the process chambers 600 and the main transfer robot 500 are disposed. The buffer unit 300 receives primitive wafers transferred by the index robot 200, and wafers processed at the process chambers 600.

Figure 5:
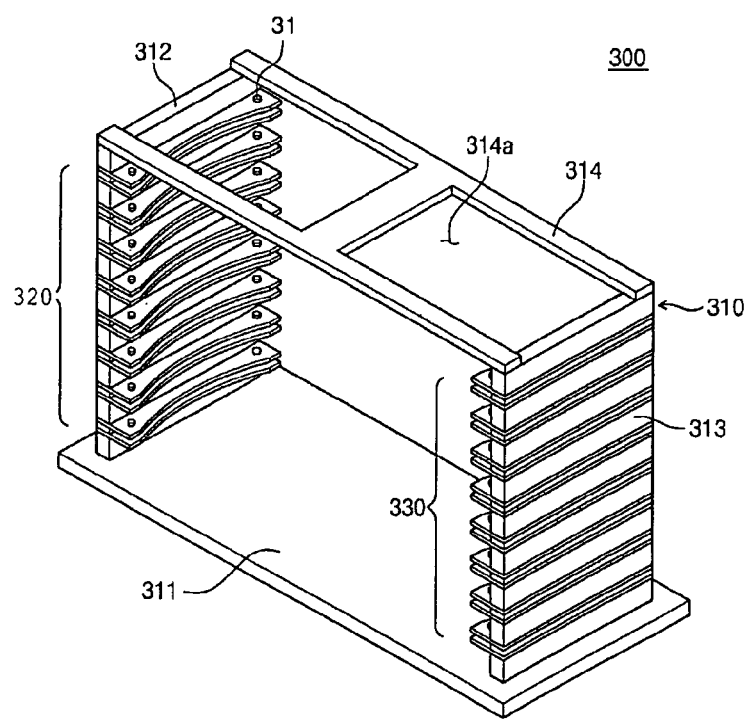
FIG. 5 is a perspective view of a buffer unit illustrated in FIG. 3.

FIG. 5 is a perspective view of the buffer unit 300 illustrated in FIG. 3.

Referring to FIGS. 3 and 5, the buffer unit 300 includes a main body 310 and first and second support parts 320 and 330.

Particularly, the main body 310 may include a bottom surface 311, first and second sidewalls 312 and 313 extending vertically from the bottom surface 311, and an upper surface 314 coupled to upper ends of the first and second sidewalls 312 and 313.

For accessing with wafers, the main body 310 has an open front wall facing the index robot 200 and an open rear wall facing the main transfer robot 500. Accordingly, it is convenient for the index robot 200 and the main transfer robot 500 to insert and take out wafers into and from the buffer unit 300.

The first and second sidewalls 312 and 313 face each other, and the upper surface 314 is partially removed to have an opening 314a.

The first and second support parts 320 and 330 are disposed in the main body 310. The first support part 320 is coupled to the first sidewall 312, and the second support part 330 is coupled to the second sidewall 313. Each of the first and second support parts 320 and 330 includes a plurality of supports. The supports of the first support part 320 are in one-to-one correspondence to the supports of the second support part 330. Wafers are received by the buffer unit 300 with ends of the wafers supported by the supports of the first support part 320 and the supports of the second support part 330, in which the wafers face the bottom surface 311.

The supports of the first and second support parts 320 and 330 are spaced a first gap from each other in the vertical direction with the number of the load index arms 221 and 222 (refer to FIG. 4) and the number of the unload index arms 223 and 224 (refer to FIG. 4). The load index arms 221 and 222 and the unload index arms 223 and 224 are also spaced the first gap, respectively. Accordingly, the index robot 200 takes out and loads a plurality of wafers at once from and into the buffer unit 300. Here, the first gap is equal to a slot gap of the FOUPs 120a, 120b, 120c, and 120d.

The respective supports of the first and second support parts 320 and 330 may be provided with guide parts 31 guiding the positions of wafers. The guide parts 31 protrude from top surfaces of the supports and support side surfaces of wafers.

As described above, the gaps between the supports of the buffer unit 300, disposed sequentially are the same as those between the index arms 221, 222, 223, and 224 that simultaneously pick up or load wafers. Accordingly, the index robot 200 takes out and loads a plurality of wafers at once from and to the buffer unit 300, thereby improving workability and productivity and reducing process time.

The main transfer robot 500 transfers primitive wafers disposed in the buffer unit 300 to the respective process chambers 600. The main transfer robot 500 is disposed at a transfer passage 400, and moves along a second transfer rail 30 disposed at the transfer passage 400. The transfer passage 400 is connected to the process chambers 600.

The main transfer robot 500 picks up primitive wafers from the buffer unit 300, and then moves along the second transfer rail 30 and provides the primitive wafers to the relevant one of the process chambers 600. Also, the main transfer robot 500 loads wafers processed in the process chambers 600 on the buffer unit 300.

Figure 6:
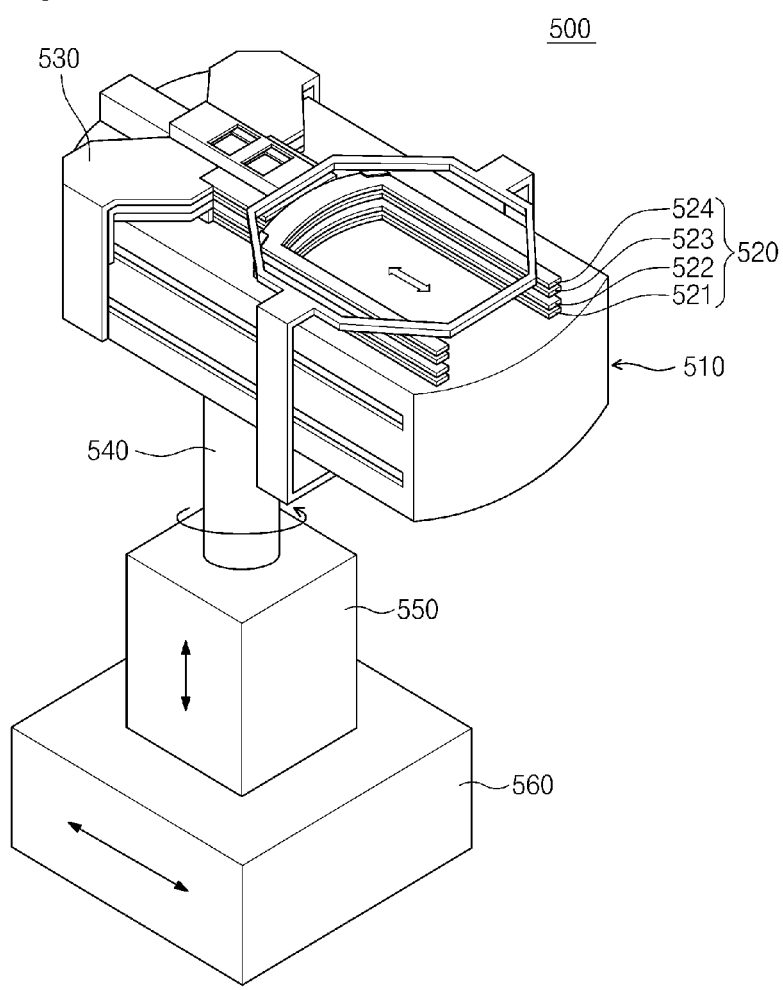
FIG. 6 is a perspective view of a main transfer robot illustrated in FIG. 3.

FIG. 6 is a perspective view of the main transfer robot 500 illustrated in FIG. 3.

Referring to FIGS. 3 and 6, the main transfer robot 500 may include a hand-driving part 510, a pick-up hand part 520, a plurality of connection parts 530, a rotation part 540, a vertical movement part 550, and a horizontal movement part 560.

Particularly, the hand-driving part 510 moves respective pick up hands 521, 522, 523, and 524 horizontally. The respective pick up hands 521, 522, 523, and 524 are independently driven by the hand-driving part 510.

An upper portion of the hand-driving part 510 is provided with the pick-up hand part 520. The pick-up hands 521, 522, 523, and 524 face each other in the vertical direction, and a wafer is loaded on each of the pick-up hands 521, 522, 523, and 524. In this embodiment, the main transfer robot 500 is provided with the four pick-up hands 521, 522, 523, and 524, but the number of the pick-up hands 521, 522, 523, and 524 may be increased according to the process efficiency of the substrate-processing system 1000.

The pick-up hands 521 and 522 transferring primitive wafers may be referred to as load pick-up hands, and the pick-up hands 523 and 524 transferring processed wafers may be referred to as unload pick-up hands. In this case, the load pick-up hands 521 and 522 and the unload pick-up hands 523 and 524 are disposed separately, not alternately. For example, the unload pick-up hands 523 and 524 may be disposed over the load pick-up hands 521 and 522. Accordingly, the main transfer robot 500 prevents processed wafers from being contaminated by primitive wafers while transferring the primitive wafers and the processed wafers, thereby improving the yield of products.

The respective load pick-up hands 521 and 522 take out the primitive wafers from the buffer unit 300 and provide the processed wafers to the unemployed one of the process chambers 600. The load pick-up hands 521 and 522 are spaced the first gap of the respective supports of the buffer unit 300. Thus, the load pick-up hands 521 and 522 can take out simultaneously the primitive wafers from the buffer unit 300.

The respective unload pick-up hands 523 and 524 take out processed wafers from the process chamber 600 that have completed a process and then load the processed wafers to the buffer unit 300. The unload pick-up hands 523 and 524 are spaced the first gap. Thus, the unload pick-up hands 523 and 524 can simultaneously load the processed wafers taken out from the process chambers 600, to the buffer unit 300.

In this embodiment, the number of the load pick-up hands 521 and 522 and the number of the unload pick-up hands 523 and 524 are two, respectively, but the numbers may be increased according to the process efficiency of the substrate-processing system 1000.

For example, the number of the supports in the buffer unit 300, spaced the first gap and disposed sequentially, and the maximum number of the index arms 221, 222, 223, and 224 in the index robot 200, taking out or loading wafers from or to the buffer unit 300 at once, and the maximum number of the pick-up hands 521, 522, 523, and 524 in the main transfer robot 500, taking out or loading wafers from or to the buffer unit 300 at once are the same.

As such, the main transfer robot 500 takes out a plurality of primitive wafers or one primitive wafer at once from the buffer unit 300. Also, the main transfer robot 500 loads a plurality of processed wafers or one processed wafer at once to the buffer unit 300. Accordingly, since a transfer time of wafers is reduced, the substrate-processing system 1000 can reduce the process time and improve the productivity.

The pick-up hands 521, 522, 523, and 524 are connected to the connection parts 530. The connection parts 530 coupled to the hand-driving part 510 horizontally move the connected pick-up hands 521, 522, 523, and 524 according to driving of the hand-driving part 510.

The rotation part 540 is disposed under the hand-driving part 510. The rotation part 540 is coupled to the hand-driving part 510 and rotates to rotate the hand-driving part 510. Accordingly, the pick-up hands 521, 522, 523, and 524 rotate together.

The vertical movement part 550 is disposed under the rotation part 540, and the horizontal movement part 560 is disposed under the vertical movement part 550. The vertical movement part 550 is coupled to the rotation part 540 and moves the rotation part 540 upward and downward, so as to adjust vertical positions of the hand-driving part 510 and the pick-up hand part 520. The horizontal movement part 560 is coupled to the second transfer rail 30 and moves along the second transfer rail 30. Accordingly, the main transfer robot 500 moves between the buffer unit 300 and the process chambers 600.

Both sides of the transfer passage 400 where the main transfer robot 500 is disposed are provided with the respective process chambers 600 processing primitive wafers and forming processed wafers. Processes performed in the process chambers 600 include a cleaning process for cleaning primitive wafers. Each two of the process chambers 600 face each other and the transfer passage 400 is disposed between the two process chambers 600. The three process chambers 600 are disposed on each of the both sides of the transfer passage 400.

Although the substrate-processing system 1000 includes the six process chambers 600 in this embodiment, the number of the process chambers 600 may be increased or decreased according to the process efficiency and the footprint conditions of the substrate-processing system 1000. Also, although the process chambers 600 are disposed in a single layer structure in this embodiment, twelve process chambers may be classified into two six-process-chamber groups in a multi-layer structure.

Referring again to FIGS. 3 and 4, the index robot 200 is connected to the first control unit 710, and the first control unit 710 controls a position of the index robot 200 and positions of the respective index arms 221, 222, 223, and 224.

Particularly, the first control unit 710 controls the horizontal movement part 260 of the index robot 200 to adjust a position of the index robot 200 on the first transfer rail 20, that is, a horizontal movement position of the index robot 200 and a horizontal movement velocity of the index robot 200. The first control unit 710 controls the rotation part 240 of the index robot 200 to adjust rotational positions and rotational velocities of the index arm part 220, and controls the vertical movement part 250 of the index robot 200 to adjust vertical movement positions and vertical movement velocities of the index arm part 220.

Also, the first control unit 710 controls the arm-driving part 210 to adjust horizontal movement positions and horizontal movement velocities of the respective index arms 221, 222, 223, and 224. That is, the first control unit 710 controls the velocities of the index arms 221, 222, 223, and 224 such that the index robot 200 simultaneously drives the index arms 221, 222, 223, and 224 to pick up or load a plurality of wafers.

Particularly, the first control unit 710 calculates movement velocity informations about selected ones from the index arms 221, 222, 223, and 224, to be simultaneously driven, that is, the respective maximum constant velocities, the respective maximum decelerations, and the respective maximum accelerations of the selected ones to be simultaneously driven. The first control unit 710 calculates expectation times consumed for the respective selected ones to arrive at target points, by using the movement velocity informations, and then adjusts the velocities of the respective selected ones based on a difference between the calculated expectation times.

That is, the first control unit 710 compares the calculated expectation times to select the maximum expectation time. The first control unit 710 controls the velocities such that the selected ones except for the selected one having the maximum expectation time respectively have the same time as the maximum expectation time. At this point, the first control unit 710 controls the maximum velocities of the selected ones having the expectation times less than the maximum expectation time to set the times of the selected ones to be the same. The first control unit 710 adjusts the maximum velocities to be less than the maximum velocity of the selected one having the longest expectation time. When the selected ones from the index arms 221, 222, 223, and 224 move horizontally to reach the preset maximum velocity, the selected ones are in uniform motion.

As such, the first control unit 710 controls the velocities of the index arms 221, 222, 223, and 224, so as to set times consumed for the index arms 221, 222, 223, and 224 to reach target points, to be the same. Accordingly, the index robot 200 simultaneously dispose the index arms 221, 222, 223, and 224 at the target points, so as to simultaneously take out and load two wafers from and to the FOUPs 120a, 120b, 120c, and 120d or the buffer unit 300.

The main transfer robot 500 is connected to the second control unit 720 that controls a position of the main transfer robot 500 and positions of the respective pick-up hands 521, 522, 523, and 524 (refer to FIG. 6). Since a process where the second control unit 720 controls the position of the main transfer robot 500 is the same as the process where the first control unit 710 controls the position of the index robot 200, detailed description of the second control unit 720 will be omitted.

Hereinafter, a process where at least two of the index arms 221, 222, 223, and 224 simultaneously arrive at the target points will now be described in detail with reference to the accompanying drawings. Particularly, a process of simultaneously driving the first and second unload index arms 224 and 223 will now be exemplified.

Figure 7:
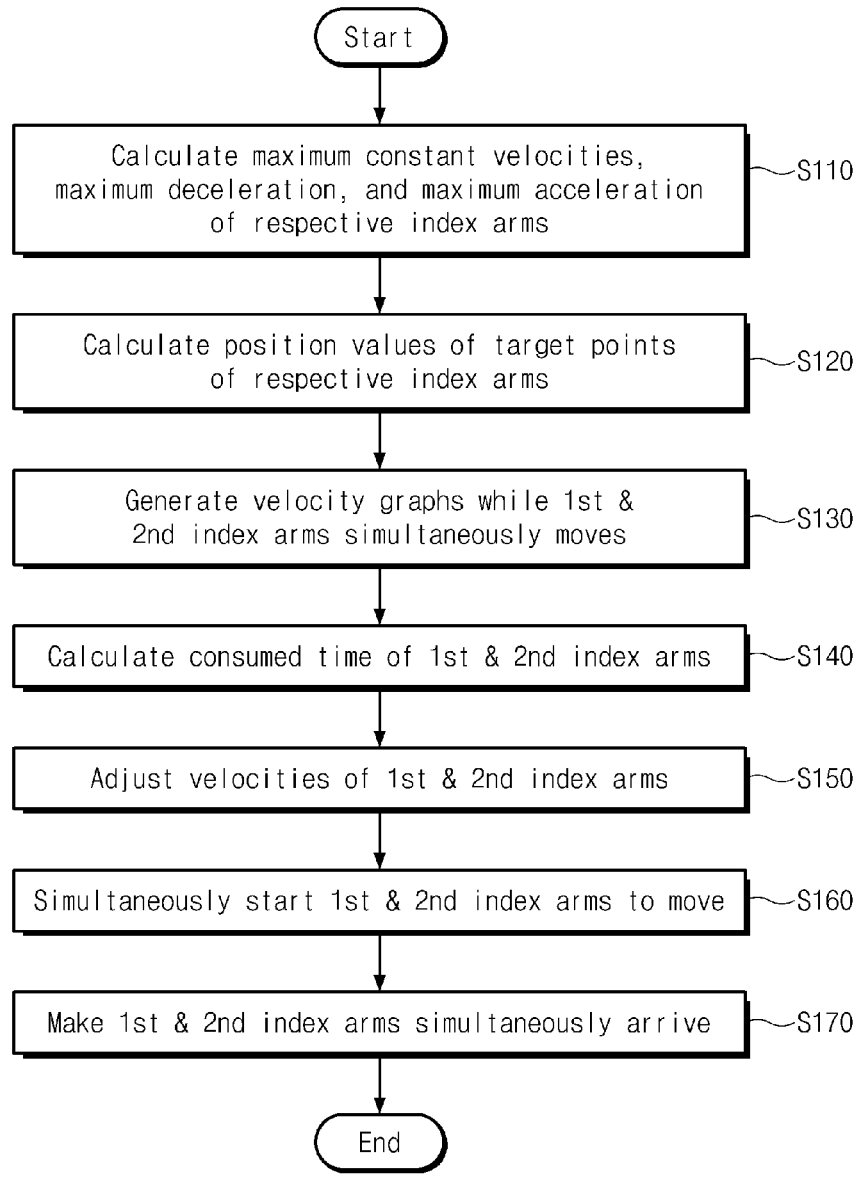
FIG. 7 is a flowchart illustrating a process of simultaneously placing a plurality of index arms of an index robot at target points according to an embodiment of the present invention.

FIG. 7 is a flowchart illustrating the process of simultaneously driving the first and second unload index arms 224 and 223 of the index robot 200 according to an embodiment of the present invention.

Referring to FIGS. 3, 4 and 7, in operation S110, the first control unit 710 calculates movement velocity informations about the respective first and second index arms 224 and 223 to be simultaneously driven.

In operation S120, the first control unit 710 calculates respective position values about the target point of the first index arm 224 and the target point of the second index arm 223. At this point, since the first index arm 224 and the second index arm 223 take out or load different wafers, the corresponding target points are also different from each other.

In operation S130, the first control unit 710 simulates velocity variations while the first index arm 224 and the second index arm 223 simultaneously start and arrive at the corresponding target points, so as to generate velocity graphs of the respective first index arm 224 and second index arm 223. At this point, the velocity graphs are based on the movement velocity informations calculated in operation S110.

In operation S140, expectation times consumed for the first index arm 224 and the second index arm 223 to arrive at the corresponding target points are respectively calculated through the simulated velocity variations of the first index arm 224 and the second index arm 223.

In operation S150, the calculated expectation times are compared to set the longest expectation time as the maximum expectation time, and the velocity of the one having the expectation time less than the maximum expectation time is reset.

For example, when the first index arm 224 has the longer expectation time than the second index arm 223, the first control unit 710 adjust the velocity of the second index arm 223, so that the second index arm 223 has the same time as that of the first index arm 224.

Particularly, the first control unit 710 resets the maximum velocity, an acceleration, and a deceleration of the second index arm 223, so that the second index arm 223 and the first index arm 224 have the same time. At this point, the maximum velocity of the second index arm 223 set to be less than that of the first index arm 224.

The maximum velocity, the acceleration, and the deceleration of the second index arm 223 are recalculated using math FIG. 1 below, respectively.

MathFigure 1

$$VMS = \frac{VR \times DR1}{MD}$$
$$AVS = \frac{AR \times DR2}{MD}$$
$$DVS = \frac{DR \times DR3}{MD}$$
[Math. 1]

Figure 1:
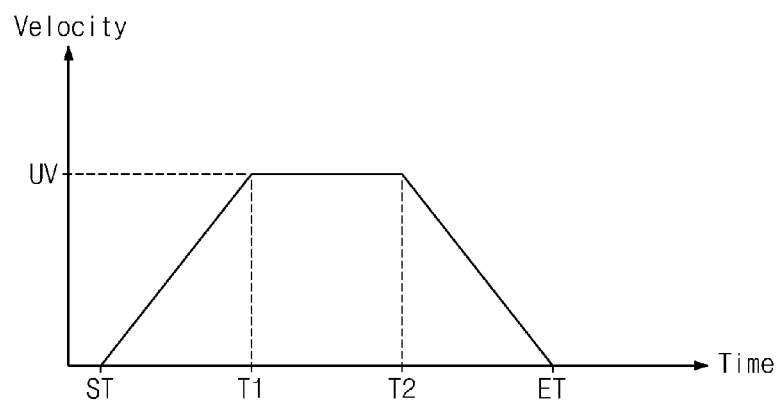
FIG. 1 is a graph illustrating velocity variation of an arm in a typical transfer robot.
Figure 2:
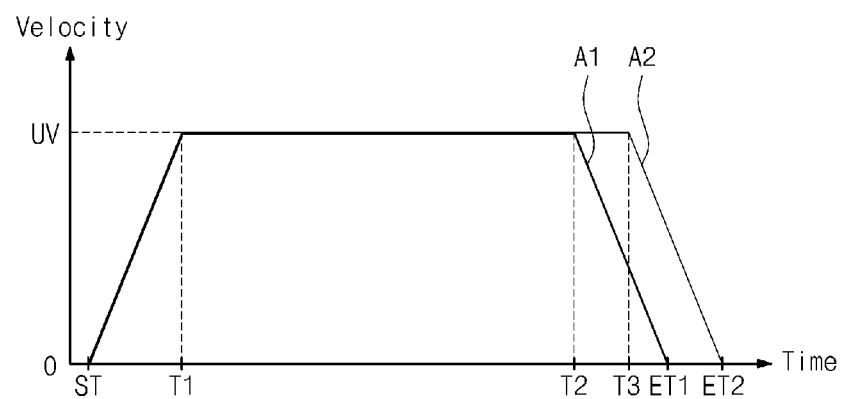
FIG. 2 is a graph illustrating velocity variation of two arms in a typical transfer robot when the arms simultaneously move.

In math FIG. 1, VMS, AVS, and DVS denote the recalculated maximum velocity, the recalculated acceleration, and the recalculated deceleration of the second index arm 223, respectively. MD denotes a distance between the start point and the target point. VR denotes the maximum velocity of the first index arm 224. DR1 denotes a distance through which the first index arm 224 moves in uniform motion at the maximum velocity. AR denotes an acceleration of the first index arm 224. DR2 denotes a distance through which the first index arm 224 moves in acceleration motion. DR denotes an deceleration of the first index arm 224. DR3 denotes a distance through which the first index arm 224 moves in deceleration motion.

In operation S160, the second index arm 223 and the first index arm 224 simultaneously start to move horizontally to take out or load wafers from or to the FOUPs 120a, 120b, 120c or 120d, or the buffer unit 300.

In operation S170, the second index arm 223 and the first index arm 224 move with the velocities adjusted by the first control unit 710, so as to simultaneously arrive at the target points and simultaneously take out or load the wafers disposed at the respectively corresponding target points.

As such, the first control unit 710 adjusts the velocities of the arm unit 220, so that the ones of the index arms 221, 222, 223, and 224, to be simultaneously driven, have the same consumed times. Accordingly, the index robot 200 makes at least two of the index arms 221, 222, 223, and 224 simultaneously arrive at the corresponding target points, so as to load or take out a plurality of wafers at once, and to reduce transfer time of the wafers, and to improve productivity.

In this embodiment, since a process where the second control unit 720 adjusts velocities of the pick-up hand unit 520 of the main transfer robot 500 to make at least two of the pick-up hands 521, 522, 523, and 524 simultaneously arrive at different target points is the same as the process where the first control unit 710 adjusts the velocities of the arm unit 220 of the index robot 200 to make at least two of the index arms 221, 222, 223, and 224 simultaneously arrive at the different target points, detailed description thereof will be omitted.

Figure 8:
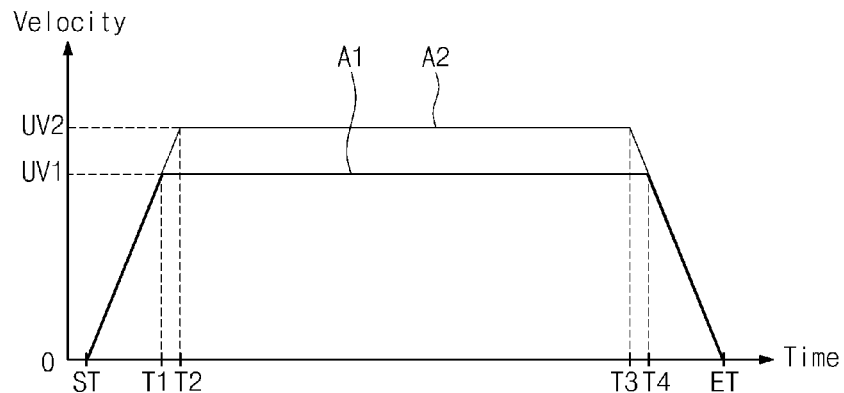
FIG. 8 is a graph illustrating velocity variation between start time points and target time points when the index arms of FIG. 7 move with velocities adjusted by a first control unit.

FIG. 8 is a graph illustrating velocity variations between start time points ST and target time points ET when the second index arm 223 and the first index arm 224 move with the velocities adjusted by the first control unit 710 as illustrated in FIG. 7.

Referring to FIGS. 8, A1 and A2 denote simultaneously driven two of the index arms 221, 222, 223, and 224, and the index arms A1 and A2 are accelerated until reaching maximum velocities UV1 and UV2, then in uniform motion for predetermined times at the maximum velocities UV1 and UV2, and then gradually decelerated until arriving at the target points.

The maximum velocities UV1 and UV2 of the simultaneously driven index arms A1 and A2 are set differently from each other, and the predetermined times when the index arms A1 and A2 in uniform motion at the respective maximum velocities UV1 and UV2 are different from each other. That is, time points T1 and T2 when the index arms A1 and A2 reach the respective maximum velocities UV1 and UV2 are different from each other, and time points T3 and T4 when the index arms A1 and A2 are decelerated after being in uniform motion at the maximum velocities UV1 and UV2 are different from each other.

However, since the start time points ST where the index arms A1 and A2 start to move horizontally are the same from each other, and the target time points ET where the index arms A1 and A2 arrive at the target points are the same, the consumed times are the same.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A substrate-processing apparatus comprising:
a storage member arranging a plurality of substrates in a vertical direction to store the substrates;
a transfer member including a plurality of transfer arms facing each other in the vertical direction, and an arm-driving part moving the respective transfer arms horizontally, the substrates being loaded on the respective transfer arms, the transfer member taking out and loading at least one substrate from and to the storage member; and
a control unit controlling a movement velocity of the transfer member and controlling the arm-driving part,
wherein the arm-driving part adjusts horizontal movement velocities of the selected ones from the transfer arms to be simultaneously driven according to controlling of the control unit, based on expectation times consumed for the selected transfer arms respectively arrive at target points in the storage member, such that the selected transfer arms simultaneously arrive at the target points.

2. The substrate-processing apparatus of claim 1, wherein the control unit calculates the expectation times of the selected respective transfer arms to be simultaneously driven, based on maximum velocities, decelerations, and accelerations of the selected respective transfer arms, and
the control unit adjusts velocities of the selected respective transfer arms based on a difference between the calculated expectation times.

3. The substrate-processing apparatus of claim 2, wherein the control part adjusts the velocities of the respective transfer arms to be simultaneously driven so that the selected transfer arms is simultaneously arrived at the target points.

4. The substrate-processing apparatus of claim 3, wherein based on the maximum velocity, the deceleration, and the acceleration of the transfer arm having the longest one of the calculated expectation times, the control unit adjusts the maximum velocity, the deceleration, and the acceleration of the transfer arm having the expectation time less than the longest expectation time.

5. A substrate-processing apparatus comprising:
a storage container spacing substrates to be processed or processed substrates in a vertical direction to store the substrates;
a buffer unit spacing the substrates to be processed and the processed substrates in the vertical direction to store the substrates;
an index robot including a plurality of index arms facing each other in the vertical direction, and an arm-driving part moving the respective index arms horizontally, the substrates being loaded on the respective index arms, the index robot transferring the substrate between the storage container and the buffer unit, the index robot taking out and loading at least one substrate from and to the storage container or the buffer unit; and
a first control unit controlling a movement velocity and a position of the index robot,
wherein the first control unit adjusts horizontal movement velocities of the selected from the index arms to be simultaneously driven according to controlling of the control unit, based on expectation times consumed for the selected index arms respectively arrive at target points in the storage container, such that the selected index arms simultaneously arrive at the target points.

6. The substrate-processing apparatus of claim 5, further comprising:
a process chamber where the substrate is processed;
a main transfer robot including a plurality of pick-up hands facing each other in the vertical direction, and a hand-driving part moving the respective pick-up hands horizontally, the substrates being loaded on the respective pick-up hands, the main transfer robot transferring the substrate between the process chamber and the buffer unit, the main transfer robot taking out and loading at least one substrate from and to the buffer unit; and
a second control unit controlling a movement velocity and a position of the main transfer robot,
wherein the second control unit controls the hand-driving part such that at least two of the pick-up hands simultaneously arrive different target points in the storage container or the buffer unit by controlling movement velocities of the respective pick-up hands.

7. A method of transferring a substrate, the method comprising:
generating movement velocity informations including maximum velocities, decelerations, and accelerations of respective transfer arms of a transfer member transferring the substrate;
calculating, by a control unit configured to calculate, based on position values of target points corresponding to the respective transfer arms and on the movement velocity informations, expectation times consumed for the respective transfer arms to arrive at the corresponding target points;
resetting velocities of the respective transfer arms, based on the calculated expectation times and on the movement velocity informations such that the transfer arms have a same consumed time; and
simultaneously and horizontally moving the transfer arms with the reset velocities to simultaneously take out or load a plurality of substrates from or to a storage member.

8. The method of claim 7, wherein the resetting of the velocities comprises:
comparing the calculated expectation times to set the longest one of the calculated expectation time as a maximum expectation time; and
resetting the velocity of the transfer arm having the expectation time less than the maximum expectation time adjust the transfer arms to have the same consumed time.

9. The method of claim 8, wherein the resetting of the velocity of the transfer arm having the expectation time less than the maximum expectation time comprises, respectively resetting the maximum velocity, the acceleration, and the deceleration of the transfer arm having the expectation time less than the maximum expectation time, based on the maximum velocity, the acceleration, and the deceleration of the transfer arm having the same expectation time as the maximum expectation time.

10. The method of claim 9, wherein the transfer arm having the expectation time less than the maximum expectation time is adjusted to have the maximum velocity less than the maximum velocity of the transfer arm having the same expectation time as the maximum expectation time.

11. The method of claim 10, wherein the resetting of the maximum velocity, the acceleration and the deceleration comprises using equations below, $$VMS = \frac{VR \times DR1}{MD}$$
$$AVS = \frac{AR \times DR2}{MD}$$
$$DVS = \frac{DR \times DR3}{MD}$$

wherein VMS, AVS, and DVS denote the reset maximum velocity, the reset acceleration, and the reset deceleration, respectively;
MD denotes a distance between a start point and a target point;
VR denotes the maximum velocity of the transfer arm having the same expectation time as the maximum expectation time;
DR1 denotes a distance through which the transfer arm having the same expectation time as the maximum expectation time moves in uniform motion at the maximum velocity;
AR denotes the acceleration of the transfer arm having the same expectation time as the maximum expectation time;
DR2 denotes a distance through which the transfer arm having the same expectation time as the maximum expectation time moves in acceleration motion;
DR denotes the deceleration of the transfer arm having the same expectation time as the maximum expectation time; and
DR3 denotes a distance through which the transfer arm having the same expectation time as the maximum expectation time moves in deceleration motion.

12. The method of claim 7, wherein
each of the transfer arms moves at the set acceleration from a start time point when the transfer arm starts to move horizontally to a first time point when the transfer arm reaches the set maximum velocity,
the transfer arm is in uniform motion at the set maximum velocity from the first time point to a second time point, and
the transfer arm moves at the set deceleration from the second time point to a time point when the transfer arm arrives at the target point.

13. A method of transferring a substrate, the method comprising:
- generating, at a first control unit configured to generate, arm velocity informations including maximum velocities, decelerations, and accelerations of respective index arms on which the substrate is loaded;
- calculating, at the first control unit configured to calculate, based on position values of target points corresponding to the respective index arms and on the arm velocity informations, expectation times consumed for the respective index arms to arrive at the corresponding target points;
- resetting, at the first control unit configured to reset, velocities of the respective index arms, based on the calculated expectation times and on the arm velocity informations such that the index arms have a same consumed time; and
- simultaneously and horizontally moving the index arms with the reset velocities to simultaneously take out or load a plurality of substrates from or to a storage container or a buffer unit.

14. The method of claim 13, further comprising:
- generating, at a second control unit, hand velocity informations including maximum velocities, decelerations, and accelerations of respective pick-up hands on which the substrate is loaded;
- calculating, at the second control unit, based on position values of target points corresponding to the respective pick-up hands and on the hand velocity informations, expectation times consumed for the respective pick-up hands to arrive at the corresponding target points;
- resetting, at the second control unit, velocities of the respective pick-up hands, based on the calculated expectation times and on the hand velocity informations such that the pick-up hands have a same consumed time; and
- simultaneously and horizontally moving the pick-up hands with the reset velocities to simultaneously take out or load the substrates from or to the buffer unit.

* * * * *